United States Patent [19]

Motoda et al.

[11] Patent Number: 5,737,350
[45] Date of Patent: Apr. 7, 1998

[54] SEMICONDUCTOR LASER HAVING MULTI-QUANTUM BARRIER INCLUDING COMPLEX BARRIER STRUCTURE AND METHOD OF MAKING THE SEMICONDUCTOR LASER

[75] Inventors: Takashi Motoda; Manabu Kato, both of Itami, Japan

[73] Assignee: Mitsubishi Denki Kabushiki Kaisha, Tokyo, Japan

[21] Appl. No.: 529,715

[22] Filed: Sep. 18, 1995

[30] Foreign Application Priority Data

Sep. 13, 1994 [JP] Japan .................... 6-223327

[51] Int. Cl.⁶ .................... H01S 3/19
[52] U.S. Cl. .................... 372/45; 372/46
[58] Field of Search .................... 372/45, 46; 359/130

[56] References Cited

U.S. PATENT DOCUMENTS

| | | | |
|---|---|---|---|
| 4,671,830 | 6/1987 | Burnham | 372/45 |
| 5,073,892 | 12/1991 | Uomi et al. | 372/45 |
| 5,091,756 | 2/1992 | Iga et al. | |
| 5,251,224 | 10/1993 | Irkawa et al. | 372/45 |
| 5,299,045 | 3/1994 | Sekiguchi | 359/130 |
| 5,345,461 | 9/1994 | Ahn et al. | 372/45 |
| 5,359,617 | 10/1994 | Kano et al. | 372/45 |

FOREIGN PATENT DOCUMENTS

| | | |
|---|---|---|
| 6346790 | 2/1988 | Japan . |
| 4010527 | 1/1992 | Japan . |
| 4174585 | 6/1992 | Japan . |
| 4273491 | 9/1992 | Japan . |
| 555697 | 3/1993 | Japan . |
| 6021562 | 1/1994 | Japan . |

OTHER PUBLICATIONS

Uenohara et al., "Analysis of Electron Wave Reflectivity and Leakage Current of Multi-Quantum Barrier: MQB", Electronics and Communications in Japan, Part 2, vol. 71, No. 5, 1988, (Nov.).

Primary Examiner—Rodney B. Bovernick
Assistant Examiner—Yisun Song
Attorney, Agent, or Firm—Leydig, Voit & Mayer, Ltd.

[57] ABSTRACT

A multi-quantum barrier layer includes alternatingly laminated barrier layers of a III-V compound semiconductor material and well layers of a III-V compound semiconductor material including the same Group V element as in the barrier layers. During the formation of the multi-quantum barrier layer it is not necessary to switch the Group V element source gas at the interface between a barrier layer and a well layer so that this interface is abrupt, improving the electron reflection efficiency of the multi-quantum barrier layer.

17 Claims, 8 Drawing Sheets

Prior Art

Fig. 9 (a)

Prior Art

Fig. 9 (b)

Prior Art

Fig. 10 (a)

Prior Art

SEMICONDUCTOR LASER HAVING MULTI-QUANTUM BARRIER INCLUDING COMPLEX BARRIER STRUCTURE AND METHOD OF MAKING THE SEMICONDUCTOR LASER

FIELD OF THE INVENTION

This invention relates to a semiconductor laser and to a method of fabricating a semiconductor laser and, more particularly, to a semiconductor laser having a multi-quantum barrier (MQB) structure and a method of fabricating such a semiconductor laser.

BACKGROUND OF THE INVENTION

Figure 10:
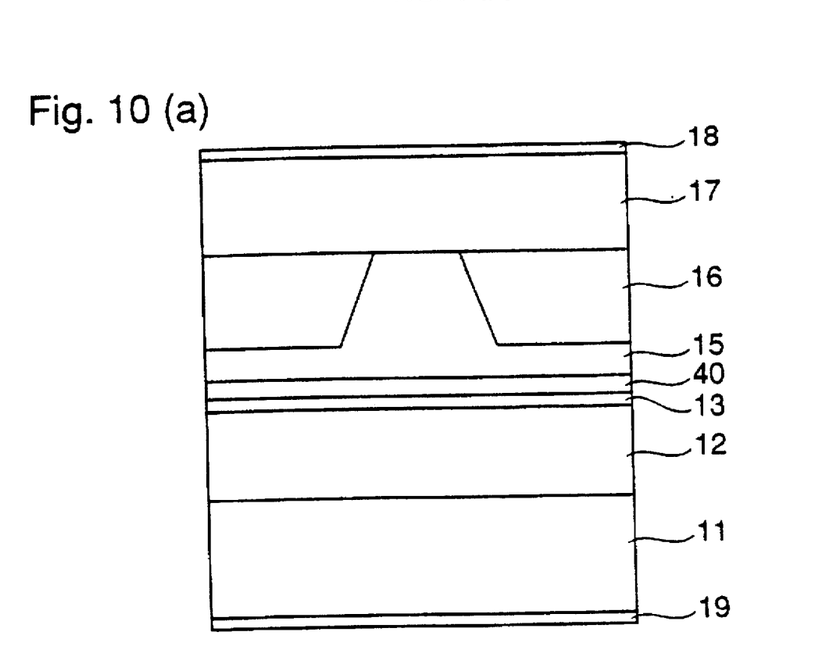
FIG. 10(a) is a cross-sectional view illustrating a prior art semiconductor laser.
FIG. 10(b) is a diagram illustrating band gap energy in the vicinity of a multi-quantum barrier structure of the prior art semiconductor laser.

FIG. 10(a) is a cross-sectional schematic view illustrating a prior art semiconductor laser producing long wavelength light and FIG. 10(b) is a diagram illustrating band gap energy in the vicinity of the active layer of this semiconductor laser. In the figures, reference numeral 11 designates an n type InP substrate, reference numeral 12 designates an n type InP cladding layer, and reference numeral 13 designates an InGaAs active layer. Reference numeral 40 designates a multi-quantum barrier (hereinafter referred to as MQB) structure that comprises an active layer side barrier layer 6 comprising InP in contact with the active layer 13, and well layers 1 comprising InGaAs and barrier layers 2 comprising InP that are alternately laminated in ten periods or so. The active layer side barrier layer 6 prevents resonant tunneling of electrons and its thickness is about 200 Å. The barrier layers 2 and the well layers 1 have a thickness of about 40 Å, respectively. Reference numeral 15 designates a p type InP cladding layer with a ridge structure in its upper part. Reference numeral 16 designates an n type InP current blocking layer burying the ridge structure, reference numeral 17 designates a p type InP contact layer, reference numeral 18 designates a p side electrode comprising Au and related materials, and reference numeral 19 designates an n side electrode comprising Au and related materials. The portion indicated by a broken line in FIG. 10(b) shows the effective band gap energy of the MQB structure 40.

The n type cladding layer 12, the active layer 13, the MQB structure 40, and the p type cladding layer 15 are successively formed on the semiconductor substrate 11 using MOCVD. During the formation of these layers, the MQB structure 40 is formed by first forming the active layer side barrier layer 6, and then repeating a process of growing the well layer 1, switching source gases, growing a barrier layer 2, and again switching source gases. Next, a stripe-shaped insulating film (not shown in the figure) is formed on the p type cladding layer 15, and then, using this insulating film as a mask, the p type cladding layer 15 is etched to form the stripe-shaped ridge. The n type current blocking layer 16 is formed to bury the ridge, the insulating film is removed, and the contact layer 17 is formed. Finally, the n side electrode 19 and the p side electrode 18 are formed on the rear surface of the substrate 11 and on the contact layer 17, respectively, preferably by evaporation, thereby producing the semiconductor laser.

When current flows through the semiconductor laser such that the n side electrode 19 is negative and the p side electrode 18 is positive, since the contact layer 17, the current blocking layer 16, and the p type cladding layer 15 form a pnp structure, the current is blocked there and holes are injected from the contact layer 17 through the ridge portion of the p type cladding layer 15 and the MQB structure layer 40 into the active layer 13. Electrons are injected into the active layer 13 through the substrate 11 and the n type cladding layer 12. Recombination of holes and electrons occurs in the active layer 13, producing laser light.

The MQB structure layer, comprising well layers and barrier layers, generally increases an effective barrier height due to the interference of electron waves. The MQB structure layer 40 of the semiconductor laser reflects some of the electrons that pass through the active layer 13 and would go forward toward the p type cladding layer 15 during electron injection into the active layer 13. Those electrons are injected into the active layer 13, thereby improving the light emitting efficiency of the semiconductor laser.

The prior art semiconductor laser includes the MQB structure layer 40 to prevent the flow of electrons. In this MQB structure layer 40, since electrons are reflected at the interface between the well layer 1 and the barrier layer 2, the abruptness of this interface between the well layer 1 and the barrier layer 2 (hereinafter referred to as well-barrier interface) has a great influence on the electron reflection efficiency of the MQB structure layer 40. For the MQB structure 40 of the prior art semiconductor laser, InGaAs is used for the well layer 1 and InP is used for the barrier layer 2. Therefore, when the MQB structure layer 40 is formed after the well layer 1 comprising InGaAs is formed, it is necessary to switch completely from As to P, both Group V elements, in order to grow the barrier layer 2 comprising InP. However, interface control when Group V elements are completely switched is extremely difficult, particularly when switching from a layer including As to a layer including P. Because of carry-over of the As, it is difficult to obtain an abrupt interface, and it is also difficult to form the MQB structure layer 40 having an abrupt well-barrier interface. Consequently, it is difficult to improve the electron reflection efficiency of the MQB structure layer 40 and the light emitting efficiency of the semiconductor laser cannot be improved.

In recent years, because of the miniaturization of semiconductor devices in general, a need for a thinner semiconductor laser has arisen and it is necessary to make the MQB structure as thin as possible in order to meet this need. However, a semiconductor laser having an MQB structure that is sufficiently thin has not yet been realized.

SUMMARY OF THE INVENTION

It is an object of the present invention to provide a high-performance semiconductor laser having an MQB structure layer with excellent electron reflection efficiency and a method of fabricating the laser.

It is another object of the present invention to provide a thin semiconductor laser having an MQB structure that is thinner than the prior art MQB structure.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser includes a multi-quantum barrier layer, and the multi-quantum barrier layer comprises a barrier layer having a double layer structure comprising a first barrier layer of a III-V compound semiconductor material including a Group V element and a second barrier layer disposed on the first barrier layer and comprising a III-V compound semiconductor material including a Group V element different from the Group V element of the first barrier layer and a well layer comprising a III-V compound semiconductor material including the same Group V element as the Group V element of the first barrier layer, wherein the barrier layer having the double layer structure and the well layer are alternately laminated. Therefore, it is unnecessary to switch the source of the Group V element at the interface of the first barrier layer and the well layer during growth of those layers. The interface between the first barrier layer and the well layer within the multi-quantum barrier layer is abrupt, improving the electron reflection efficiency of the multi-quantum barrier layer.

According to a second aspect of the present invention, a semiconductor laser includes a multi-quantum barrier layer, and the multi-quantum barrier layer comprises a barrier layer having a double layer structure comprising a first barrier layer of a III-V compound semiconductor material including a Group V element and a second barrier layer disposed on the first barrier layer and comprising a III-V compound semiconductor material including a Group V element different from the Group V element of the first barrier layer and a well layer comprising a III-V compound semiconductor material including the same Group V element as the Group V element of the second barrier layer, wherein the barrier layer having the double layer structure and the well layer are alternately laminated. Therefore, it is unnecessary to switch the source of the Group V element at the interface between the second barrier layer and the well layer during growth of those layers, and the interface between the second barrier layer and the well layer within the multi-quantum barrier layer is abrupt, improving the electron reflection efficiency of the multi-quantum barrier layer.

According to a third aspect of the present invention, a semiconductor laser includes a multi-quantum barrier layer, and the multi-quantum barrier layer comprises a barrier layer having a triple layer structure comprising a first barrier layer of a III-V compound semiconductor material including a Group V element, a second barrier layer disposed on the first barrier layer and comprising a III-V compound semiconductor material including a Group V element different from the Group V element of the first barrier layer, and a third barrier layer disposed on the second barrier layer and comprising a III-V compound semiconductor material including the same Group V element as the Group V element of the first barrier layer, and a well layer comprising a III-V compound semiconductor material including the same Group V element as the Group V element of the first barrier layer, wherein the barrier layer having the triple layer structure and the well layer are alternately laminated. Therefore, it is unnecessary to switch the source of the Group V element at the interface between the barrier layer and the well layer during growth of those layers, and the interface between the barrier layer and the well layer within the multi-quantum barrier layer is abrupt, improving the electron reflection efficiency of the multi-quantum barrier layer.

According to a fourth aspect of the present invention, a semiconductor laser includes a multi-quantum barrier layer, and the multi-quantum barrier layer comprises a barrier layer having a double layer structure comprising a first barrier layer of a III-V compound semiconductor material including a Group V element and a second barrier layer disposed on the first barrier layer and comprising a III-V compound semiconductor material including a Group V element different from the Group V element of the first barrier layer and a well layer having a double layer structure comprising a first well layer comprising a III-V compound semiconductor material including the same Group V element as the Group V element of the second barrier layer and a second well layer disposed on the first well layer and comprising a III-V compound semiconductor material including the same Group V element as the Group V element of the first barrier layer, wherein the barrier layer having the double layer structure and the well layer having the double layer structure are alternately laminated. Therefore, it is unnecessary to completely switch the source of the Group V element at the interface of the second barrier layer and the first well layer, and it is also unnecessary to switch the source of the Group V element at the interface between the first barrier layer and the second well layer during growth of those layers, and the interface between the barrier layer and the well layer within the multiquantum barrier layer is abrupt, improving the electron reflection efficiency of the multi-quantum barrier layer.

According to a fifth aspect of the present invention, a semiconductor laser includes a multi-quantum barrier layer, and the multi-quantum barrier layer of a barrier layer comprising a III-V compound semiconductor material including a Group V element and a well layer having a double layer structure comprising a first well layer of a III-V compound semiconductor material including a Group V element different from the Group V element of the barrier layer and a second well layer disposed on the first well layer and comprising a III-V compound semiconductor material including the same Group V element as the Group V element of the barrier layer, wherein the barrier layer and the well layer having the double layer structure are alternately laminated. Therefore, it is unnecessary to switch the source of the Group V element at the interface between the barrier layer and the second well layer during growth of those layers, and the interface between the barrier layer and the second well layer within the multi-quantum barrier layer is abrupt, improving the electron reflection efficiency of the multi-quantum barrier layer.

According to a sixth aspect of the present invention, a semiconductor laser includes a multi-quantum barrier layer, and the multi-quantum barrier layer comprises a barrier layer of a III-V compound semiconductor material including a Group V element and a well layer having a double layer structure comprising a first well layer of a III-V compound semiconductor material including the same Group V element as the Group V element of the barrier layer and a second well layer disposed on the first well layer and comprising a III-V compound semiconductor material including a Group V element different from the Group V element of the barrier layer, wherein the barrier layer and the well layer having the double layer structure are alternately laminated. Therefore, it is unnecessary to switch the source of the Group V element at the interface between the barrier layer and the first well layer during growth of those layers, and the interface between the barrier layer and the first well layer within the multi-quantum barrier layer is abrupt, improving the electron reflection efficiency of the multi-quantum barrier layer.

According to a seventh aspect of the present invention, a semiconductor laser includes a multi-quantum barrier layer, and the multi-quantum barrier layer comprises a barrier layer of a III-V compound semiconductor material including a Group V element, a well layer having a triple layer structure comprising a first well layer of a III-V compound semiconductor material including the same Group V element as the Group V element of the barrier layer, a second well layer disposed on the first well layer and comprising a III-V compound semiconductor material including the same Group V element as the Group V element of the barrier layer, and a third well layer disposed on the second well layer and comprising a III-V compound semiconductor material including the same Group V element as the Group V element of the barrier layer, wherein the barrier layer and the well layer having the triple layer structure are alternately laminated. Therefore, it is unnecessary to switch the source of the Group V element at the interface between the barrier layer and the well layer during growth of those layers, and the interface between the barrier layer and the well layer within the multi-quantum barrier layer is abrupt, improving the electron reflection efficiency of the multi-quantum barrier layer.

According to an eighth aspect of the present invention, a semiconductor laser includes a multi-quantum barrier layer, and the multi-quantum barrier layer comprises a barrier layer of a III-V compound semiconductor material including a Group V element and a well layer comprising a III-V compound semiconductor material including the same Group V element as the Group V element of the barrier layer, wherein the barrier layer and the well layer are alternately laminated. Therefore, it is unnecessary to switch the source of the Group V element at the interface between the barrier layer and the well layer during growth of those layers, and the interface between the barrier layer and the well layer within the multiquantum barrier layer is abrupt, improving the electron reflection efficiency of the multi-quantum barrier layer.

According to a ninth aspect of the present invention, a semiconductor laser has a multi-quantum barrier layer, and a method of fabricating the multi-quantum barrier layer includes supplying source gases for and growing a first semiconductor layer, replacing a source gas with a source gas for growing a second semiconductor layer having a band gap energy narrower than the band gap energy of the first semiconductor layer, and immediately after replacing the source gas for growing the first semiconductor layer with the source gas for growing the second semiconductor layer, replacing the source gas for growing the second semiconductor layer with the source gas for growing the first semiconductor layer so that the first semiconductor layer is grown, the processes of successively replacing the source gases being repeated. Therefore, the thickness of the multiquantum barrier layer can be reduced.

According to a tenth aspect of the present invention, the semiconductor laser described as in the ninth aspect of the present invention has a multi-quantum barrier layer, and the method of fabricating the multi-quantum barrier layer further includes halting the growth of each of the first semiconductor layers immediately after each first semiconductor layer becomes devoid of materials of the second semiconductor layer. Therefore, the thickness of the multi-quantum barrier layer can be reduced.

According to an eleventh aspect of the present invention, in a method of fabricating a semiconductor laser, a method of fabricating a multi-quantum barrier layer includes successively forming a first barrier layer comprising a III-V compound semiconductor material including a Group V element and a second barrier layer comprising a III-V compound semiconductor material including a Group V element different from the Group V element in the first barrier layer and forming a well layer comprising a III-V compound semiconductor material including the same Group V element as the Group V element of the first barrier layer, wherein the process of successively forming the first barrier layer and the second barrier layer and the process of forming the well layer are repeated. Therefore, it is unnecessary to switch the source of the Group V element at the interface between the first barrier layer and the well layer during growth of those layers, and the interface between the first barrier layer and the well layer within the multi-quantum barrier layer is abrupt, improving the electron reflection efficiency of the multi-quantum barrier layer.

According to a twelfth aspect of the present invention, in a method of fabricating a semiconductor laser, a method of fabricating a multi-quantum barrier layer includes successively forming a first barrier layer comprising a III-V compound semiconductor material including a Group V element and a second barrier layer comprising a III-V compound semiconductor material including a Group V element different from the Group V element of the first barrier layer and forming a well layer comprising a III-V compound semiconductor material including the same Group V element as the Group V element in the second barrier layer, wherein the process of successively forming the first barrier layer and the second barrier layer and the process of forming the well layer are repeated. Therefore, it is unnecessary to switch the source of the Group V element at the interface between the second barrier layer and the well layer, and the interface between the second barrier layer and the well layer within the multi-quantum barrier layer is abrupt, improving the electron reflection efficiency of the multi-quantum barrier layer.

According to a thirteenth aspect of the present invention, in a method of fabricating a semiconductor laser, a method of fabricating a multi-quantum barrier layer includes successively forming a first barrier layer comprising a III-V compound semiconductor material including a Group V element, a second barrier layer comprising a III-V compound semiconductor material including a Group V element different from the Group V element of the first barrier layer, and a third barrier layer comprising a III-V compound semiconductor material including the same Group V element as the Group V element of the first barrier layer, and forming a well layer comprising a III-V compound semiconductor material including the same Group V element as the Group V element in the first barrier layer, wherein the process of successively forming the first barrier layer, the second barrier layer, and the third barrier layer and the process of forming the well layer are repeated. It is unnecessary to switch the source of the Group V element at the interface between the barrier layer and the well layer during growth of those layers, and the interface between the barrier layer and the well layer within the multi-quantum barrier layer is abrupt, improving the electron reflection efficiency of the multi-quantum barrier layer.

According to a fourteenth aspect of the present invention, in a method of fabricating a semiconductor laser, a method of fabricating a multi-quantum barrier layer includes successively forming a first barrier layer comprising a III-V compound semiconductor material including a Group V element and a second barrier layer comprising a III-V compound semiconductor material including a Group V element different from the Group V element of the first barrier layer, and successively forming a first well layer comprising a III-V compound semiconductor material including the same Group V element as the Group V element of the second barrier layer and a second well layer comprising a III-V compound semiconductor material including the same Group V element as the Group V element of the first barrier layer, wherein the process of successively forming the first barrier layer and the second barrier layer and the process of successively forming the first well layer and the second well layer are repeated. Therefore, it is unnecessary to switch completely the source of the Group V element at the interface between the second barrier layer and the first well layer, and it also is unnecessary to switch the Group V element at the interface between the first barrier layer and the second well layer during growth of those layers, and the interface between the barrier layer and the well layer within the multi-quantum barrier layer is abrupt, improving the electron reflection efficiency of the multi-quantum barrier layer.

According to a fifteenth aspect of the present invention, in a method of fabricating a semiconductor laser, a method of fabricating a multi-quantum barrier layer includes the steps of forming a barrier layer comprising a III-V compound semiconductor material including a Group V element and successively forming a first well layer comprising a III-V compound semiconductor material including a Group V element different from the Group V element in the barrier layer and a second well layer comprising a III-V compound semiconductor material including the same Group V element as the Group V element of the barrier layer, wherein the process of forming the barrier layer and the process of successively forming the first well layer and the second well layer are repeated. Therefore, it is unnecessary to switch the source of the Group V element at the interface between the barrier layer and the second well layer during growth of those layers, and the interface between the barrier layer and the second well layer within the multi-quantum barrier layer is abrupt, improving the electron reflection efficiency of the multi-quantum barrier layer.

According to a sixteenth aspect of the present invention, in a method of fabricating a semiconductor laser, a method of fabricating a multi-quantum barrier layer includes forming a barrier layer comprising a III-V compound semiconductor material including a Group V element and successively forming a first well layer comprising a III-V compound semiconductor material including the same Group V element as the Group V element of the barrier layer and a second well layer disposed on the first well layer and comprising a III-V compound semiconductor material including a Group V element different from the Group V element in the barrier layer, wherein the process of forming the barrier layer and the process of successively forming the first well layer and the second well layer are repeated. Therefore, it is unnecessary to switch the source of the Group V element at the interface between the barrier layer and the first well layer during growth of those layers, and the interface between the barrier layer and the well layer within the multi-quantum barrier layer is abrupt, improving the electron reflection efficiency of the multi-quantum barrier layer.

According to a seventeenth aspect of the present invention, in a method of fabricating a semiconductor laser, a method of fabricating a multi-quantum barrier layer includes forming a barrier layer comprising a III-V compound semiconductor material including a Group V element and successively forming a first well layer comprising a III-V compound semiconductor material including the same Group V element as the Group V element in the barrier layer, a second well layer comprising a III-V compound semiconductor material including a Group V element different from the Group V element in the barrier layer, and a third well layer comprising a III-V compound semiconductor material including the same Group V element as the Group V element in the barrier layer, wherein the process of forming the barrier layer and the process of successively forming the first well layer, the second well layer, and the third well layer are repeated. Therefore, it is unnecessary to switch the source of the Group V element at the interface between the barrier layer and the well layer during growth of those layers, and the interface between the barrier layer and the well layer within the multi-quantum barrier layer is abrupt, improving the electron reflection efficiency of the multi-quantum barrier layer.

According to an eighteenth aspect of the present invention, in a method of fabricating a semiconductor laser, a method of fabricating a multi-quantum barrier layer includes forming a barrier layer comprising a III-V compound semiconductor material including a Group V element and forming a well layer comprising a III-V compound semiconductor material including the same Group V element as the Group V element in the barrier layer, wherein the barrier layer and the well layer are alternately laminated. Therefore, it is unnecessary to switch the source of the Group V element at the interface between the barrier layer and the well layer during growth of those layers, and the interface between the barrier layer and the well layer within the multiquantum barrier layer is abrupt, improving the electron reflection efficiency of the multi-quantum barrier layer.

According to a nineteenth aspect of the present invention, a method of fabricating a semiconductor laser includes a method of fabricating a multi-quantum barrier layer, and the method of fabricating the multi-quantum barrier layer includes supplying source gases for and growing a first semiconductor layer, replacing a source gas with a source gas for and growing a second semiconductor layer having a band gap energy narrower than the band gap energy of the first semiconductor layer, and immediately after replacing the source gas for growing the first semiconductor layer with the source gas for growing the second semiconductor layer, replacing the source gas for growing the second semiconductor layer with the source gas for growing the first semiconductor layer so that the first semiconductor layer is grown, wherein the process of successively replacing the source gases is repeated. Therefore, the thickness of the multi-quantum barrier layer is reduced.

According to a twentieth aspect of the present invention, in the method of fabricating the semiconductor laser as described in the nineteenth aspect of the present invention, the method of fabricating the multi-quantum barrier layer further includes halting growing of each of the first semiconductor layers immediately after the first semiconductor layer becomes devoid of elements of the second semiconductor layer. Therefore, the thickness of the multi-quantum barrier layer is reduced.

DETAILED DESCRIPTION OF THE PREFERRED EMBODIMENTS

Embodiment 1

Figure 1:
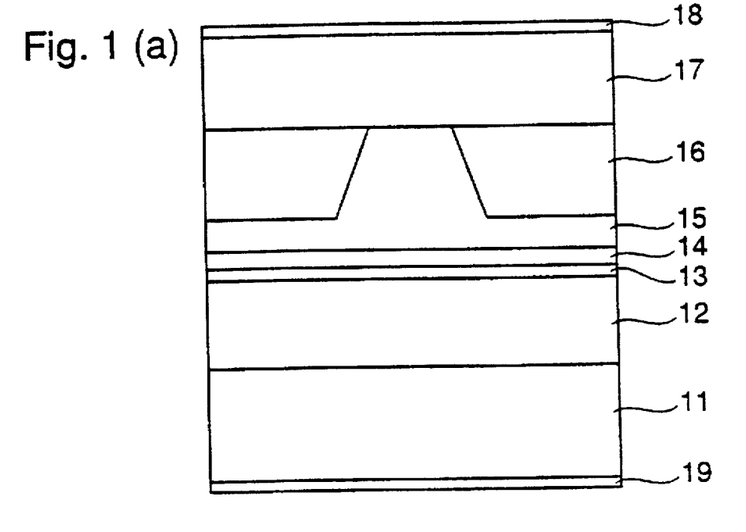
FIG. 1(a) is a cross-sectional view illustrating a semiconductor laser according to a first embodiment of the present invention.
FIG. 1(b) is a diagram illustrating band gap energy in the vicinity of a multi-quantum barrier structure of the semiconductor laser.

FIG. 1(a) is a cross-sectional view illustrating a semiconductor laser according to a first embodiment of the present invention, and FIG. 1(b) is a diagram of band gap energy in the vicinity of an active layer and a multi-quantum barrier (hereinafter referred to as MQB) structure of the semiconductor laser. In the figures, reference numeral 11 designates an n type InP substrate, reference numeral 12 designates an n type InP cladding layer, reference numeral 13 designates an InGaAs active layer, reference numeral 14 designates a multi-quantum barrier (MQB) structure that comprises an active layer side barrier layer 6 comprising InP and disposed in contact with the active layer 13, and InGaAs well layers 1 and barrier layers 2 which are alternately laminated in ten periods or so. The active layer side barrier layer 6 prevents resonant tunneling of electrons and its thickness is about 200 Å. The well layer 1 and the barrier layer 2 have a thickness of about 40 Å, respectively. The barrier layer 2 comprises a GaAs barrier layer 2a and an InP barrier layer 2b laminated with the GaAs barrier layer 2a on the active layer 13 side, and the thickness of the GaAs barrier layer 2a is 5–10 Å. Reference numeral 15 designates a p type InP cladding layer, the upper portion of which forms a ridge structure, reference numeral 16 designates an n type InP current blocking layer burying the ridge structure, reference numeral 17 designates a p type InP contact layer, reference numeral 18 designates a p side electrode comprising Au and related materials, and reference numeral 19 designates an n side electrode comprising Au and related materials.

First, the n type cladding layer 12, the active layer 13, the MQB structure 14, and the p type cladding layer 15 are successively formed on the semiconductor substrate 11 using metal organic chemical vapor deposition (MOCVD) while switching source gases. During the formation of these layers, the MQB structure 14 is formed by first forming the active layer side barrier layer 6 and then repeating a process of forming the well layer 1 while switching source gases and a process of first forming the GaAs barrier layer 2a while switching source gases and then forming the InP barrier layer 2b while again switching source gases. Next, a stripe-shaped insulating film (not shown in the figure) is formed on the p type cladding layer 15, and, using this insulating film as a mask, the p type cladding layer 15 is etched to form the stripe-shaped ridge. Then, the n type current blocking layer 16 is formed to bury the ridge. After the insulating film is removed, the contact layer 17 is formed, and the n side electrode 19 and the p side electrode 18 are formed on the rear surface of the substrate 11 and on the contact layer 17, respectively, thereby completing the semiconductor laser.

When current flows through the semiconductor laser such that the n side electrode 19 is negative and the p side electrode 18 is positive, since the contact layer 17, the current blocking layer 16, and the p type cladding layer 15 form a pnp structure, the current is blocked there and holes are injected from the contact layer 17 through the ridge portion of the p type cladding layer 15 and the MQB structure layer 14 into the active layer 13. Electrons are injected into the active layer 13 through the substrate 11 and the n type cladding layer 12, and recombination of holes and electrons occurs in the active layer 13 to produce laser light.

The multi-quantum barrier structure of this first embodiment will be described. The barrier layer 2 of the multi-quantum barrier (MQB) structure 14 of this embodiment is a double layer structure, the layer at the side of the active layer 13 being the GaAs barrier layer 2a and the layer at the side of the p type cladding layer 15 being the InP barrier layer 2b. The formation of the MQB structure 14 having such a barrier layer 2 with the double layer structure is, as previously described, accomplished by repeating the process of forming the well layer 1, then growing the GaAs barrier layer 2a, after switching source gases, then growing the InP barrier layer 2b, after switching source gases, and again growing the well layer 1 after switching source gases. During this process, growing the barrier layer 2a after the growth of the well layer 1 requires switching from the growth of InGaAs to the growth of GaAs, and switching from the barrier layer 2b to the well layer 1 requires switching from the growth of InP to the growth of InGaAs. Therefore, with the MQB structure 14 structured as above, a growth process that includes switching from a layer including As to a layer including P, making interface control particularly difficult, does not take place at the interface between the well layer 1 and the barrier layer 2 (hereinafter referred to as well-barrier interface). Thus, the abruptness of the well-barrier interface can be improved. Although switching from the layer including As to the layer including P takes place when switching from the growth of the GaAs barrier layer 2a of the barrier layer 2 to the InP barrier layer 2b, since it is not necessary to reflect electrons at that interface, the interface does not have to be abrupt.

As described above, the abruptness of the well-barrier interface in the MQB structure can be improved, the electron reflection efficiency of the MQB structure can be improved, and a high-performance semiconductor laser having excellent light emitting efficiency can be obtained in this first embodiment.

Figure 2:
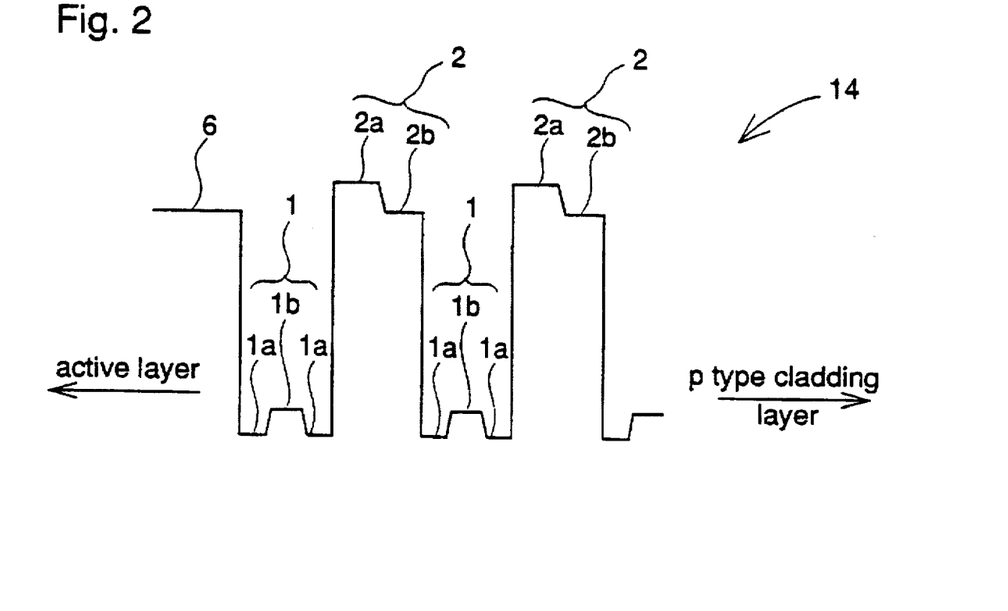
FIG. 2 is a diagram illustrating band gap energy in the vicinity of a multi-quantum barrier structure of another semiconductor laser according to the first embodiment of the present invention.

While in the first embodiment a single layer of InGaAs is used as the well layer 1, this invention can be applied where the well layer 1 of the semiconductor laser of the first embodiment shown in FIG. 1(b) has a triple layer structure realized by inserting an InGaAsP well layer 1b between the InGaAs well layers 1a shown in FIG. 2. The same effect as in the first embodiment can be obtained. Furthermore, the well layer 1 can have a multiple layer structure realized by inserting a plurality of layers between the InGaAs well layers 1a, and a similar effect as in the first embodiment can be obtained.

While in the first embodiment InGaAs is used as the well layer, another material, such as InAs, can be used for the well layer 1, and a similar effect can be obtained. Particularly, when InGaAsP is used as the well layer 1, it becomes possible to form the InGaAsP well layer without stopping the P source gas, the Group V element source gas, after the InP barrier layer 2b is formed. The abruptness of the interface between the InP barrier layer 2b and the well layer 1 can be improved and a semiconductor laser having better light emitting efficiency is obtained.

Embodiment 2

Figure 3:
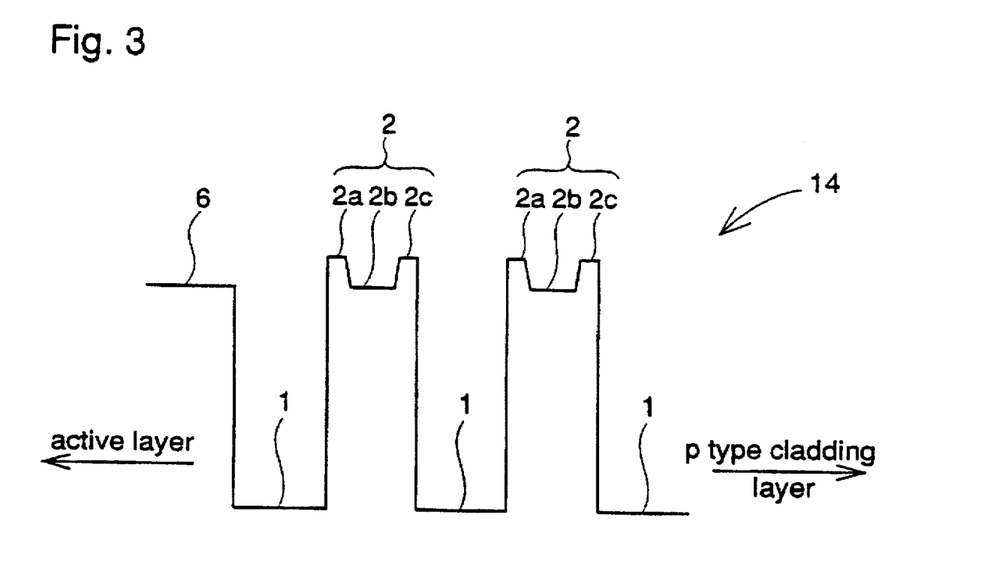
FIG. 3 is a diagram illustrating band gap energy in the vicinity of a multi-quantum barrier structure of a semiconductor laser according to a second embodiment of the present invention.

FIG. 3 is a diagram illustrating the band gap energy of the principal part of an MQB structure of a semiconductor laser according to a second embodiment of the present invention. In the figure, the same reference numerals used in FIGS. 1(a) and 1(b) designate the same or similar parts. Reference numeral 2c designates a GaAs barrier layer. The semiconductor laser of the second embodiment is the same as the first embodiment except that the GaAs barrier layer 2c is disposed between the InP barrier layer 2b and the well layer 1 in the MQB structure 14, making a triple layer structure barrier layer 2.

For the semiconductor laser of the second embodiment, switching from the growth of the well layer 1 to the growth of the barrier layer 2 of the MQB structure 14 becomes a switch from InGaAs to GaAs, as in the first embodiment, and a switch from the growth of the barrier layer 2 to the growth of the well layer 1 of the MQB structure 14 becomes a switch from GaAs to InGaAs. Because of this, a growth including switching from a layer including As to a layer including P, that makes the interface control particularly difficult, does not take place at the well-barrier interface. A switch from a layer including P to a layer including As does not take place at the well-barrier interface either, and the well-barrier interface can be made much more abrupt. Although the growth of layers that requires a switch of Group V elements, that is, the growth of layers requiring a switch from the GaAs barrier layer 2a including As to the InP barrier layer 2b including P, and the growth of layers requiring a switch from the InP barrier layer 2b including P to the GaAs barrier layer 2c including As take place within the barrier layer 2, it is not necessary to reflect electrons at the interfaces between these layers. Therefore, even though these interfaces are not abrupt, the characteristics of the barrier layer 2 are not affected.

In the second embodiment, a similar effect as in the first embodiment can be obtained. The interface at the barrier layer 2 and the well layer 1 is abrupt, and a high-performance semiconductor laser having better light emitting efficiency is obtained.

Figure 4:
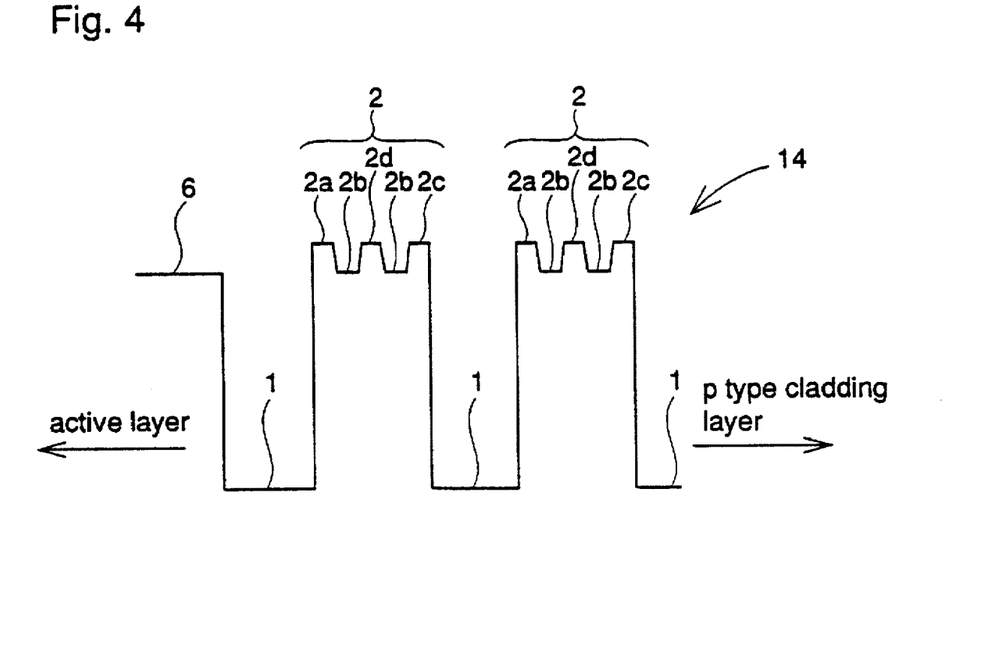
FIG. 4 is a diagram illustrating band gap energy in the vicinity of a multi-quantum barrier structure of a semiconductor laser according to a first modification of the second embodiment of the present invention.

While, in the second embodiment, the barrier layer 2 has a triple layer structure, a plurality of other layers can be disposed inside the InP barrier layer 2b of the barrier layer 2 in accordance with this invention. For example, as shown in FIG. 4, the GaAs barrier layer 2d can be disposed inside the InP barrier layer 2b of a semiconductor laser that has the same structure as in the second embodiment, and a similar effect as in the second embodiment can be obtained.

Figure 5:
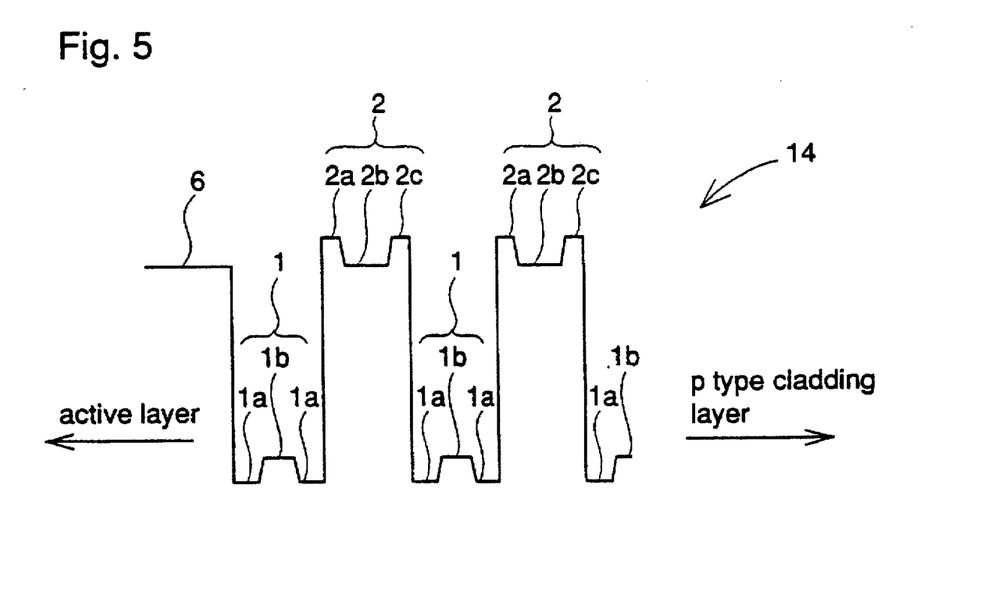
FIG. 5 is a diagram illustrating band gap energy in the vicinity of a multi-quantum barrier structure of a semiconductor laser according to a second modification of the second embodiment of the present invention.

In the second embodiment, a single layer of InGaAs is used as the well layer 1. The well layer 1 of the semiconductor laser of the second embodiment can have a triple layer structure instead of a single layer of InGaAs with the InGaAsP well layer 1b inserted between the InGaAs well layers 1a. A similar effect as in the second embodiment is also obtained in this case.

Embodiment 3

Figure 6:
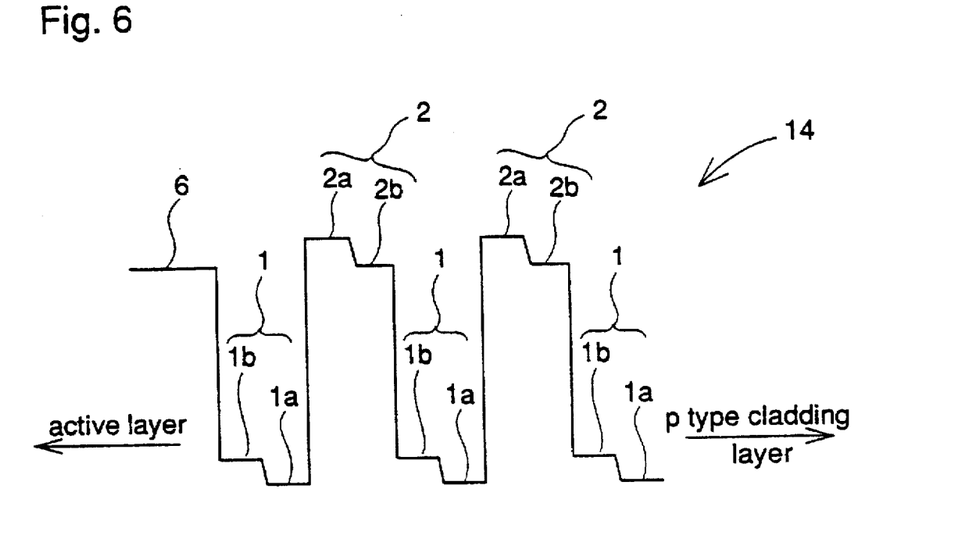
FIG. 6 is a diagram illustrating band gap energy in the vicinity of a multi-quantum barrier structure of a semiconductor laser according to a third embodiment of the present invention.

FIG. 6 is a diagram illustrating band gap energy of the principal part of an MQB structure of a semiconductor laser according to a third embodiment of the present invention. In the figure, the same reference numerals used in FIGS. 1(a) and 1(b) designate the same or similar parts. Reference numeral 1a designates an InGaAs well layer and reference numeral 1b designates an InGaAsP well layer.

The semiconductor laser of the third embodiment is the same as the first embodiment except that the well layer 1 of the MQB structure 14 has a double layer structure comprising the InGaAsP well layer 1b on the side of the substrate 11 and the InGaAs well layer 1a on the side of the p type cladding layer 15. In this structure, a switch from the growth of the well layer 1 to the growth of the barrier layer 2a requires switching from InGaAs to GaAs as in the first embodiment. A switch from the growth of the InP barrier layer 2b to the growth of the InGaAsP well layer 1b is achieved. When switching from the barrier layer 2 to the well layer 1, since a complete switch from P to As becomes unnecessary, the abruptness of the growth interface where the well layer 1 switches to the barrier layer 2 can be improved, and the growth interface where the barrier layer 2 switches to the well layer 1 can have excellent abruptness, thereby providing a high performance semiconductor laser.

In this embodiment, an InP barrier layer having a single layer is used as the barrier layer of the MQB structure instead of the barrier layer 2 having the double layer structure comprising the GaAs barrier layer 2a and the InP barrier layer 2b illustrated for the first embodiment. The well layer having the triple layer structure obtained by sandwiching the InGaAsP well layer 1b between the InGaAs well layers 1a can be used as the well layer 1. In this case, since it also becomes unnecessary to switch completely from P to As at the growth interface between the well layer 1 and the barrier layer 2, the growth interface where the well layer 1 switches to the barrier layer 2 as well as the growth interface where the barrier layer 2 switches to the well layer 1 have excellent abruptness, and a high-performance semiconductor laser is provided.

Embodiment 4

Figure 7:
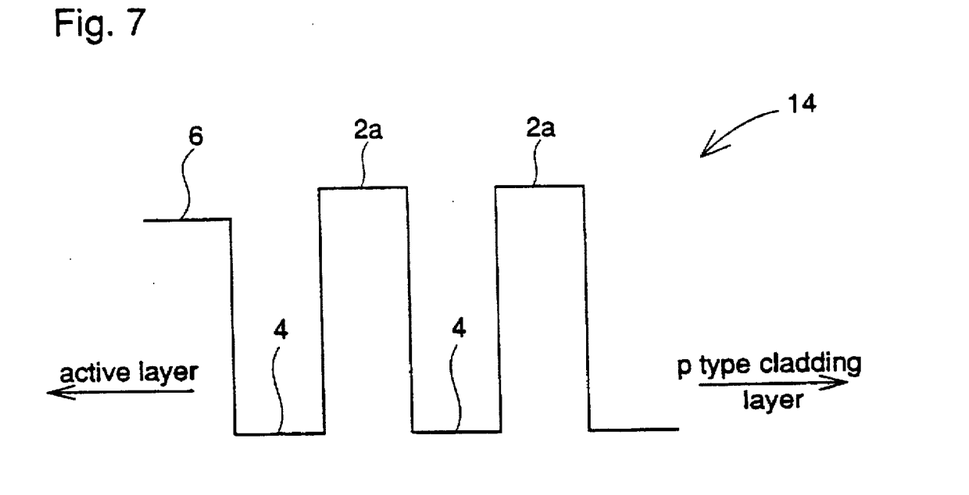
FIG. 7 is a diagram illustrating band gap energy in the vicinity of a multi-quantum barrier structure of a semiconductor laser according to a fourth embodiment of the present invention.

FIG. 7 is a diagram illustrating the band gap energy of the principal part of an MQB structure of a semiconductor laser according to a fourth embodiment of the present invention. In the figure, the same reference numerals used in FIGS. 1(a) and 1(b) designate the same or similar parts. Reference numeral 4 designates an InAs well layer.

The semiconductor laser of the fourth embodiment is the same as the first embodiment except that the well layer 4 comprising InAs is used instead of the well layer 1 comprising InGaAs of the MQB structure 14, and except that the barrier layer 2a having a single layer solely comprising GaAs is used instead of the barrier layer 2 having a double layer structure comprising the GaAs barrier layer 2a and the InP barrier layer 2b. Because of this structure, the growth of the barrier layer 2a after the well layer 4 and the growth of the well layer 4 after the barrier layer 2a are conducted by switching from InAs to GaAs or the other way around. Therefore, it is not necessary switch growth from a layer including As to a layer including P or the other way around, which makes the interface control particularly difficult. Since it is only necessary to switch growth between In and Ga, the abruptness of the well-barrier interface is excellent, the electron reflection efficiency of the MQB structure 14 is improved, and a high-performance semiconductor laser having excellent light emitting efficiency is provided.

While, in the fourth embodiment, the InAs well layer 4 and the GaAs barrier layer 2a are used, two different materials that include a common Group V element and have different band gap energies can be used for the barrier layer and the well layer in this invention. For example, an InP layer and a GaP layer can be used for the well layer and the barrier layer, respectively. Then, it is not necessary to stop the source of the Group V element, that is P, when switching from the growth of the well layer to the growth of the barrier layer or the other way around, and a similar effect as in the fourth embodiment is obtained.

While in the first, second, third, and fourth embodiments, semiconductor lasers comprising InP and related materials are described, this invention can be applied to semiconductor lasers comprising other III-V compound semiconductors and related materials and similar effects as in each of the previous embodiments obtained.

Embodiment 5

Figure 8:
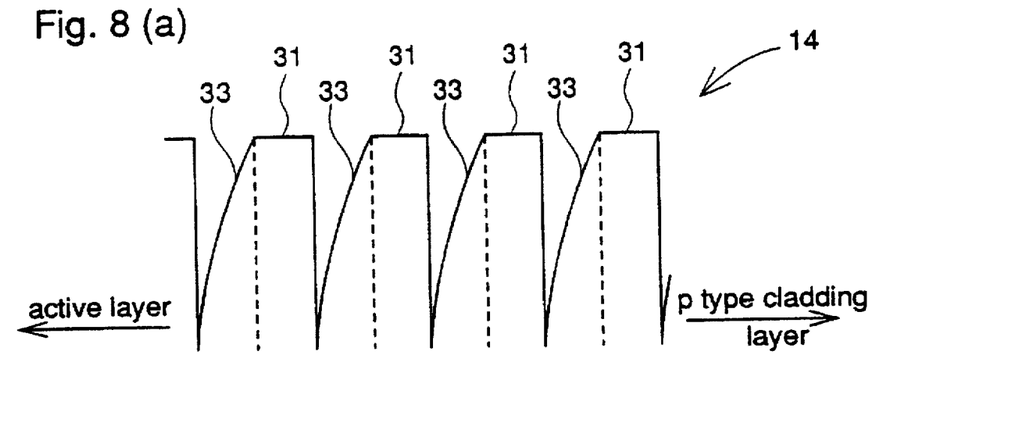
FIGS. 8(a) and 8(b) are diagrams illustrating band gap energy in the vicinity of a multi-quantum barrier structure of a semiconductor laser according to a fifth embodiment of the present invention.

FIGS. 8(a) and 8(b) are diagrams illustrating band gap energy of the principal part of an MQB structure of a semiconductor laser according to a fifth embodiment of the present invention. In the figures, reference numeral 31 designates an InP barrier layer and reference numeral 33 designates an intermediate layer. The semiconductor laser in the fifth embodiment is the same as in the first embodiment except that the structure of the MQB structure 14 of the semiconductor laser is modified.

Figure 9:
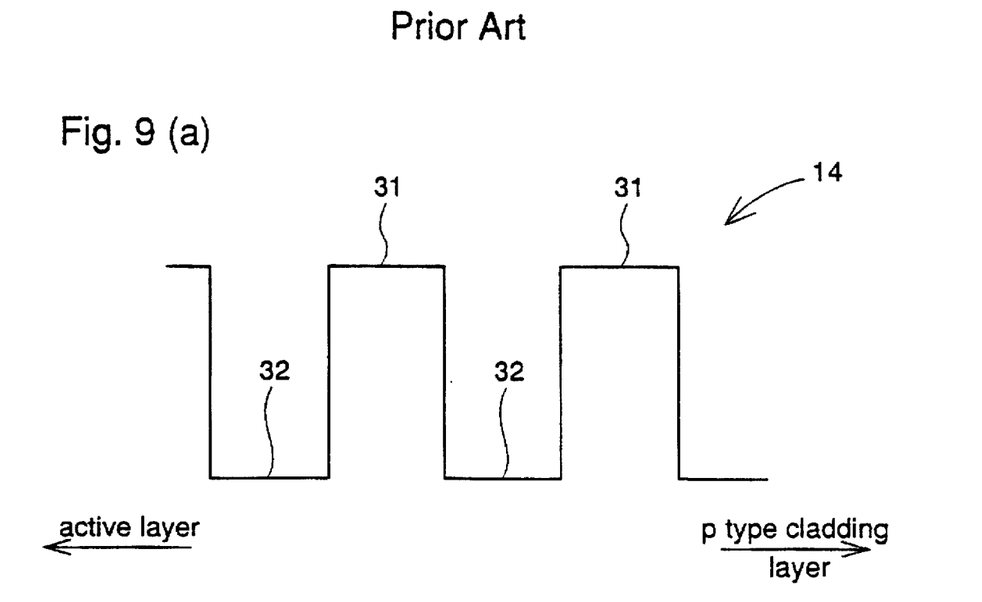
FIGS. 9(a) and 9(b) are diagrams illustrating band gap energy in the vicinity of a multi-quantum barrier structure of a prior art semiconductor laser that are referred to in conjunction with the description of a structure of a semiconductor laser according to a fifth embodiment of the present invention.

FIGS. 9(a) and 9(b) are schematic diagrams illustrating band gap energy of an MQB structure of a prior art semiconductor laser in conjunction with the description of the semiconductor laser according to the fifth embodiment of the present invention. In the figures, the same reference numerals used in FIGS. 8(a) and 8(b) designate the same or similar parts. Reference numeral 32 designates an InAs well layer.

The MQB structure 14 of the prior art semiconductor laser comprises the InAs well layers 32 and the InP barrier layers 31 periodically arranged as shown in FIG. 9(a). Electrons are reflected at the interface between the well layer 32 and the barrier layer 31. Since it was previously thought that the interface between the well layer 32 and the barrier layer 31 was abrupt, it was necessary to have the well layer 32 in a specified thickness. However, as in the structure of the prior art semiconductor laser, it is actually difficult to make the interface, switching from the InAs well layer 32 to the InP barrier layer 31, an interface at which the band gap energy changes abruptly. Consequently, an intermediate layer 33 with a composition gradually changing from InAs to InP is formed on the active layer side of the barrier layer 31. In the MQB structure 14 having a structure such as this, electrons are reflected only at the interface where the InP barrier layer 31 changes to the InAs well layer 32.

In the fifth embodiment, the InP barrier layer 31 is formed and, then, immediately after the source gas is switched to the one to form the InAs well layer 32, the source gas is again switched to form the barrier layer 31 and the barrier layer 31 is formed. The band gap energy is illustrated in FIG. 8(a). In the MQB structure of the semiconductor laser in this embodiment, the interface at which the barrier layer 31 is switched to the intermediate layer 33 becomes an abrupt interface, and electrons are reflected at this interface. Because of this, the intermediate layer 33 serves as the well layer, eliminating the need for the disposition of the well layer, and a semiconductor laser having the MQB structure 14 that is thinner than the prior art MQB structure by the amount of the well layer can be provided.

In this embodiment, a semiconductor laser having the MQB structure 14 is fabricated by repeating the process of forming the InP barrier layer 31 and, then, immediately after switching the source gas to form the InAs well layer 32, switching the source gas to form the barrier layer 31, thereby forming the barrier layer 31 again. Therefore, a semiconductor laser that is thinner than a prior art semiconductor laser can be obtained.

In the fifth embodiment, the intermediate layer 33 is formed and, then, the barrier layer 31 is formed. However, the MQB structure 14 can be formed by repeating the processes of forming the intermediate layer 33 and, immediately after that, switching the source gas to form the well layer and, immediately after that, switching the source gas to form the barrier layer, thereby forming the intermediate layer 33 again, so that the MQB structure 14 having a band gap energy with a jagged edge shape as shown in FIG. 8(b) is formed. For these processes, since the time required for the intermediate layer 33 to be completely formed after the introduction of the gas for forming the barrier layer depends on the apparatus used for the growth, the time interval most suited must be determined beforehand, preferably by experimentation. Since in the MQB structure 14 having a structure such as this, the interface between the adjoining intermediate layers 33 is an abrupt interface, and electrons are efficiently reflected at this interface. Therefore, the structure 14 functions as an MQB structure and it becomes unnecessary to form the barrier layer. Thus, a semiconductor laser having an MQB structure that is thinner than a prior art MQB structure by the amount equal to the sum of the well layers and the barrier layers can be provided.

While the present invention as applied to a semiconductor laser producing long wavelength light comprising InP and related materials is described as the fifth embodiment, the present invention can be applied to semiconductor lasers producing short wavelength light and visible wavelength light or to semiconductor lasers comprising III-V compound semiconductor materials and II-VI compound semiconductor materials. A similar effect as in the fifth embodiment can also be obtained in these cases.

In the first, second, third, fourth, and fifth embodiments, an n type semiconductor substrate is used and electrons are prevented from passing through the MQB structure. However, the present invention can also be applied to a p type semiconductor substrate and holes prevented from passing through the MQB structure. Similar effects as in each of the previously described embodiments can be obtained. In this case, it is necessary to design the MQB structure such that the composition of the MQB structure prevents holes from passing.

Furthermore, while, in the first, second, third, fourth, and fifth embodiments, the MQB structure is disposed in contact with the active layer and electrons are prevented from passing through the MQB structure, the MQB structure can be located in other positions within the semiconductor laser, and a high-performance semiconductor laser can still be provided. For example, the MQB structure can be located between the cladding layer and the current blocking layer, and by preventing the flow of electrons or holes, it is possible to decrease leakage current more reliably.

Figure 11:
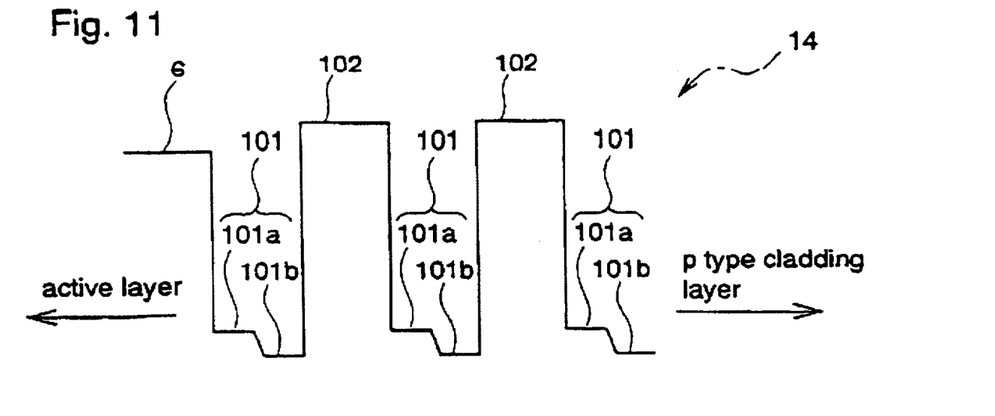
FIG. 11 is a diagram illustrating band gap energy in the vicinity of a multi-quantum barrier structure of a semiconductor laser according to a first modification of the third embodiment of the present invention.

While in the third embodiment of the present invention the multi-quantum barrier layer comprises the barrier layer 2 having a double layer structure comprising the GaAs barrier layer 2a and the InP barrier layer 2b and the well layer 1 has a double layer structure comprising the InGaAsP well layer 1b and the InGaAs well layer 1a, the present invention can be applied, as shown in FIG. 11, to a multi-quantum barrier layer comprising a barrier layer 102 of a III-V compound semiconductor material including a Group V element and a well layer having a double layer structure, the double layer structure comprising a first well layer 101a comprising a III-V compound semiconductor material including a Group V element different from the Group V element in the barrier layer and a second well layer 101b disposed on the first well layer 101a and comprising a III-V compound semiconductor material including the same Group V element as in the barrier layer 102, the barrier layer and the well layer being alternatingly laminated. A similar effect as in the third embodiment can be obtained even in this case.

Figure 12:
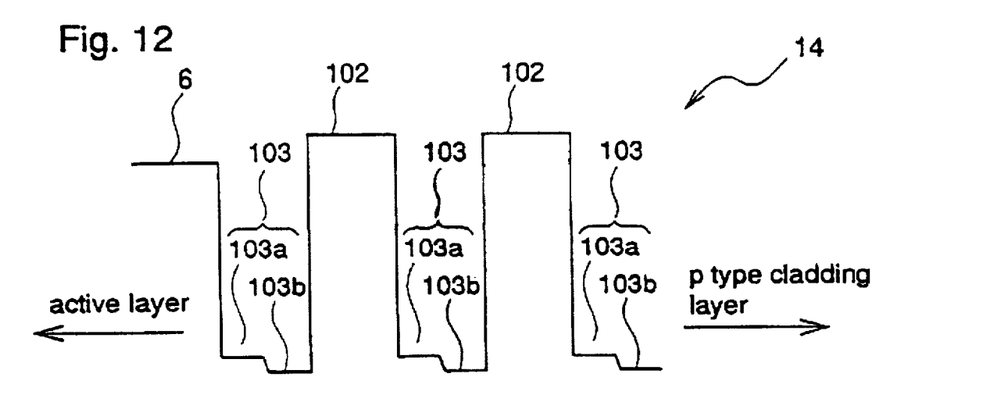
FIG. 12 is a diagram illustrating band gap energy in the vicinity of a multi-quantum barrier structure of a semiconductor laser according to a second modification of the third embodiment of the present invention.

While in the third embodiment of the present invention the multi-quantum barrier layer comprises the barrier layer 2 having a double layer structure comprising the GaAs barrier layer 2a and the InP barrier layer 2b and the well layer having a double layer structure comprises the InGaAsP well layer 1b and the InGaAs well layer 1a, the present invention can be applied, as shown in FIG. 12, to a multi-quantum barrier layer structure comprising a barrier layer and a well layer having a double layer structure, the double layer structure comprising a first well layer 103a comprising a III-V compound semiconductor material including the same Group V element as in the barrier layer 102 and a second well layer 103b disposed on the first well layer 103a and comprising a III-V compound semiconductor material including a Group V element different from the Group V element in the barrier layer 102, the barrier layer and the well layer being alternatingly laminated. In this case, the growth interface at which the second well layer 103b switches to the barrier layer 102 has excellent abruptness and a high performance semiconductor laser can be provided.

Figure 13:
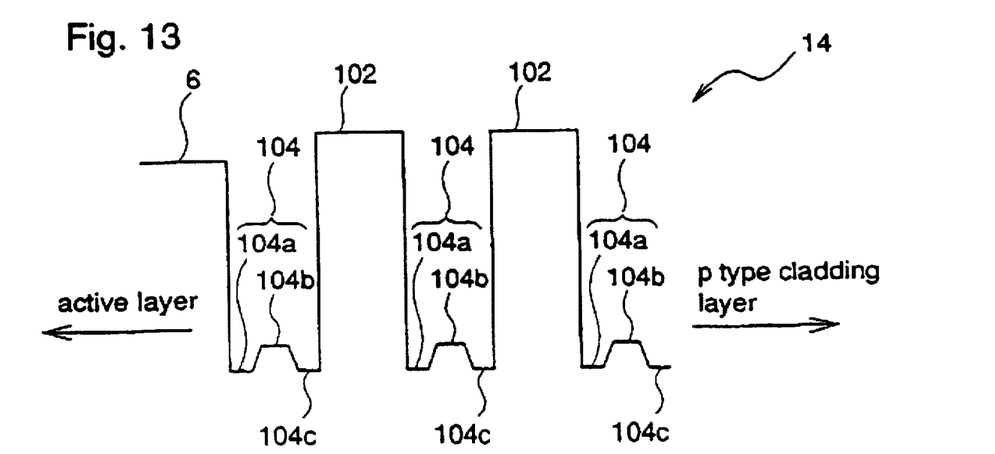
FIG. 13 is a diagram illustrating band gap energy in the vicinity of a multi-quantum barrier structure of a semiconductor laser according to a third modification of the third embodiment of the present invention.

While in the third embodiment of the present invention the multi-quantum barrier layer comprises the barrier layer 2 having a double layer structure comprising the GaAs barrier layer 2a and the InP barrier layer 2b and the well layer 1 has a double layer structure comprising the InGaAsP well layer 1b and the InGaAs well layer 1a, the present invention can be applied, as shown in FIG. 13, to a multi-quantum barrier structure comprising a barrier layer 102 of a III-V compound semiconductor material including a Group V element and a well layer having a triple layer structure, the triple layer structure comprising a first well layer 104a of a III-V compound semiconductor material including the same Group V element as in the barrier layer, a second well layer 104b disposed on the first well layer 104a and comprising a III-V compound semiconductor material including the same Group V element as in the barrier layer 102, and a third well layer 104c disposed on the second well layer 104b and comprising a III-V compound semiconductor material including the same Group V element as in the barrier layer 102, the barrier layer and the well layer being alternatingly laminated. A similar effect as in the third embodiment can be obtained even in this case.

What is claimed is:

1. A semiconductor laser having a multi-quantum barrier layer, the multi-quantum barrier layer comprising:

a plurality of barrier layer structures, each barrier layer structure comprising a first barrier layer comprising a III-V compound semiconductor material including a Group V element and having a first band gap energy, and a second barrier layer disposed on the first barrier layer, comprising a III-V compound semiconductor material including a Group V element different from the Group V element in the first barrier layer, and having a second band gap energy different from the first band gap energy; and a plurality of well layer structures, each well layer structure comprising a first well layer comprising a III-V compound semiconductor material comprising two group V elements including the same Group V element as in the first barrier layer, and having a third band gap energy, and a second well layer disposed on the first well layer, comprising a III-V compound semiconductor material including one of the Group V elements in the first well layer, and having a fourth band gap energy different from the third band gap energy, the barrier layer structures and the well layer structures being alternatingly laminated.

2. The semiconductor laser of claim 1 wherein the first barrier layer comprises GaAs, the second barrier layer comprises InP, and the first well layer comprises InGaAs.

3. The semiconductor laser of claim 1 wherein each well layer structure comprises a third well layer disposed on the second well layer comprising a III-V compound semiconductor material including the same Group V element as in the first well layer and having the third band gap energy.

4. A semiconductor laser having a multi-quantum barrier layer, the multi-quantum barrier layer comprising:

a plurality of barrier layer structures, each barrier layer structure comprising a first barrier layer comprising a III-V compound semiconductor material including a Group V element and having a first band gap energy, and a second barrier layer disposed on the first barrier layer, comprising a III-V compound semiconductor material including a Group V element different from the Group V element in the first barrier layer, and having a second band gap energy different from the first band gap energy; and a plurality of well layer structures, each well layer structure comprising a first well layer comprising a III-V compound semiconductor material including the same Group V element as in the second barrier layer and having a third band gap energy, and a second well layer disposed on the first well layer, comprising a III-V compound semiconductor material including the same Group V element as in the first barrier layer, and having a fourth band gap energy different from the third band gap energy, the barrier layer structures and the well layer structures being alternatingly laminated.

5. The semiconductor laser of claim 4 wherein the first barrier layer comprises GaAs, the second barrier layer comprises InP, the first well layer comprises InGaAsP, and the second well layer comprises InGaAs.

6. A semiconductor laser having a multi-quantum barrier layer, the multi-quantum barrier layer comprising:

a plurality of barrier layer structures, each barrier layer structure comprising a first barrier layer comprising a III-V compound semiconductor material including a Group V element and having a first band gap energy, a second barrier layer disposed on the first barrier layer, comprising a III-V compound semiconductor material including a Group V element different from the Group V element in the first barrier layer, and having a second band gap energy different from the first band gap energy, and a third barrier layer disposed on the second barrier layer, comprising a III-V compound semiconductor material including the same Group V element as in the first barrier layer, and having the first band gap energy; and a plurality of well layer structures, each well layer structure comprising a first well layer comprising a III-V compound semiconductor material including the same Group V element as in the second barrier layer and having a third band gap energy, and a second well layer disposed on the first well layer, comprising a III-V compound semiconductor material including the same Group V element as in the first well layer, and having a fourth band gap energy different from the third band gap energy, the barrier layer structures and the well layer structures being alternatingly laminated.

7. The semiconductor laser of claim 6 wherein the first barrier layer and the third barrier layer comprise GaAs, the second barrier layer comprises InP, and the first well layer comprises InGaAs.

8. The semiconductor laser of claim 6 wherein each well layer structure comprises a third well layer disposed oil the second well layer, comprising a III-V compound semiconductor material including the same Group V element as in the first well layer, and having the third band gap energy.

9. A semiconductor laser having a multi-quantum barrier layer, the multi-quantum barrier layer comprising:

a plurality of barrier layers, each barrier layer comprising a III-V compound semiconductor material including a Group V element; and a plurality of well layer structures, each well layer structure comprising a first well layer comprising a III-V compound semiconductor material including a Group V element different from the Group V element in the barrier layer and having a first band gap energy, and a second well layer disposed on the first well layer, comprising a III-V compound semiconductor material including the same Group V element as in the barrier layer, and having a second band gap energy different from the first band gap energy, the barrier layers and the well layer structures being alternatingly laminated.

10. A semiconductor laser having a multi-quantum barrier layer, the multi-quantum barrier layer comprising:

a plurality of barrier layers, each barrier layer comprising a III-V compound semiconductor material including a Group V element; and a plurality of well layer structures, each well layer structure comprising a first well layer comprising a III-V compound semiconductor material including the same Group V element as in the barrier layer and having a first band gap energy, and a second well layer disposed on the first well layer, comprising a III-V compound semiconductor material including a Group V element different from the Group V element in the barrier layer, and having a second band gap energy different from the first band gap energy, the barrier layers and the well layer structures being alternatingly laminated.

11. The semiconductor laser having a multi-quantum barrier layer of claim 10 wherein each of the well layer structures comprises a third well layer disposed on the second well layer, comprising a III-V compound semiconductor material including the same Group V element as in the barrier layer, and having the first band gap energy.

12. A method of fabricating a multi-quantum barrier layer including:

successively forming a barrier layer structure comprising a first barrier layer comprising a III-V compound semiconductor material including a Group V element and having a first band gap energy, and a second barrier layer on the first barrier layer, comprising a III-V compound semiconductor material including a Group V element different from the Group V element in the first barrier layer, and having a second band gap energy different from the first band gap energy;

forming a well layer structure comprising a first well layer comprising a III-V compound semiconductor material comprising two group V elements including the same Group V element as in the first barrier layer and having a third band gap energy, and a second well layer on the first well layer, comprising a III-V compound semiconductor material including one of the Group V elements in the first well layer, and having a fourth band gap energy different from the third band gap energy; and repeatedly successively forming the barrier layer structure and the well structure.

13. A method of fabricating a multi-quantum barrier layer including:

successively forming a barrier layer structure comprising a first barrier layer comprising a III-V compound semiconductor material including a Group V element and having a first band gap energy, and a second barrier layer on the first barrier layer, comprising a III-V compound semiconductor material including a Group V element different from the Group V element in the first barrier layer, and having a second band gap energy different from the first band gap energy;

forming a well layer comprising a III-V compound semiconductor material including the same Group V element as in the second barrier layer and having a third band gap energy, and a second well layer on the first well layer, comprising a III-V compound semiconductor material including the same Group V element as in the first barrier layer, and a fourth band gap energy different from the third band gap energy; and repeatedly successively forming the barrier layer structure and the well layer structure.

14. A method of fabricating a multi-quantum barrier layer including:

successively forming a first barrier layer comprising a III-V compound semiconductor material including a Group V element and having a first band gap energy, and a second barrier layer on the first barrier layer, comprising a III-V compound semiconductor material including a Group V element different from the Group V element in the first barrier layer, and having a second band gap energy different from the first band gap energy, and a third barrier layer on the second barrier layer, comprising a III-V compound semiconductor material including the same Group V element as in the first barrier layer, and having the first band gap energy;

successively forming a first well layer comprising a III-V compound semiconductor material including the same Group V element as in the second barrier layer and a third band gap energy, and a second well layer on the first well layer, comprising a III-V compound semiconductor material including the same Group V element as in the first barrier layer, and having a fourth band gap energy different from the third band gap energy; and repeatedly successively forming the barrier layer structure and the well layer structure.

15. A method of fabricating a multi-quantum barrier layer including:

forming a first barrier layer comprising a III-V compound semiconductor material including a Group V element;

successively forming a first well layer comprising a III-V compound semiconductor material including a Group V element different from the Group V element in the barrier layer and having a first band gap energy, and a second well layer on the first well layer, comprising a III-V compound semiconductor material including the same Group V element as in the barrier layer, and having a second band gap energy different from the first band gap energy; and repeatedly successively forming the barrier layer structure and the well layer structure.

16. A method of fabricating a multi-quantum barrier layer including:

forming a barrier layer comprising a III-V compound semiconductor material including a Group V element;

successively forming a first well layer comprising a III-V compound semiconductor material including the same Group V element as in the barrier layer and having a first band gap energy, and a second well layer on the first well layer, comprising a III-V compound semiconductor material including a Group V element different from the Group V element in the barrier layer, and having a second band gap energy different from the first band gap energy; and repeatedly successively forming the barrier layer structure and the well structure.

17. The method of fabricating a multi-quantum barrier layer of claim 16 including, in forming the well layer structure, forming a third well layer on the second well layer, the third well layer comprising a III-V compound semiconductor material including the same Group V element as in the barrier layer and having the first band gap energy.

* * * * *